(12) United States Patent
Tang

(10) Patent No.: US 12,382,817 B2
(45) Date of Patent: Aug. 5, 2025

(54) DISPLAY PANEL AND MOBILE TERMINAL

(71) Applicant: Shenzhen China Star Optoelectronics Semiconductor Display Technology Co., Ltd., Shenzhen (CN)

(72) Inventor: Jia Tang, Shenzhen (CN)

(73) Assignee: SHENZHEN CHINA STAR OPTOELECTRONICS SEMICONDUCTOR DISPLAY TECHNOLOGY CO., LTD., Guangdong (CN)

(\*) Notice: Subject to any disclaimer, the term of this patent is extended or adjusted under 35 U.S.C. 154(b) by 0 days.

(21) Appl. No.: 17/610,505

(22) PCT Filed: Sep. 27, 2021

(86) PCT No.: PCT/CN2021/120888
§ 371 (c)(1),
(2) Date: Nov. 11, 2021

(87) PCT Pub. No.: WO2023/039937
PCT Pub. Date: Mar. 23, 2023

(65) Prior Publication Data
US 2024/0251632 A1 Jul. 25, 2024

(30) Foreign Application Priority Data

Sep. 17, 2021 (CN) .......................... 202111092019.X

(51) Int. Cl.
*H10K 59/123* (2023.01)
*H10K 59/80* (2023.01)

(52) U.S. Cl.
CPC . *H10K 59/80518* (2023.02); *H10K 59/80517* (2023.02)

(58) Field of Classification Search
CPC ....... H10K 59/80518; H10K 59/80517; H10K 2102/351; H10K 50/81; H10K 50/813;
(Continued)

(56) References Cited

U.S. PATENT DOCUMENTS 8,921,867 B2\* 12/2014 Okumoto .......... H10K 59/1213
 438/149
9,012,918 B2\* 4/2015 Yamazaki ............ H10D 64/518
 438/149
(Continued)

FOREIGN PATENT DOCUMENTS

CN 104576700 A 4/2015
CN 104752439 A 7/2015
(Continued)

OTHER PUBLICATIONS

Chinese Office Action issued in corresponding Chinese Patent Application No. 202111092019.X dated Oct. 17, 2022, pp. 1-9.
(Continued)

*Primary Examiner* — Sheikh Maruf
(74) *Attorney, Agent, or Firm* — Nathan & Associates; Menachem Nathan

(57) ABSTRACT

The present application provides a display panel and a mobile terminal, the display panel includes a substrate, an anode reflection layer on the substrate, an anode layer on the anode reflection layer, a light-emitting layer on the anode layer, and an auxiliary layer between the anode reflection layer and the anode layer and having a thickness not less than a first threshold value, a plurality of the anode portions in the anode layer and a plurality of the anode reflection portions in the anode reflection layer are in one-to-one correspondence and electrically connected, and a plurality of
(Continued)

light-emitting portions in the light-emitting layer and the plurality of anode portions are in one-to-one correspondence and electrically connected.

20 Claims, 2 Drawing Sheets

(58) Field of Classification Search
CPC .. H10K 50/818; H10K 50/852; H10K 50/856; H10K 59/00; H10K 59/123; H10K 59/131; H10K 59/1213
USPC .................................................. 257/295, 72
See application file for complete search history.

(56) References Cited

U.S. PATENT DOCUMENTS

| | | | | |
|---|---|---|---|---|
| 2003/0127656 | A1* | 7/2003 | Aizawa | H10K 50/85 257/79 |
| 2010/0244029 | A1* | 9/2010 | Yamazaki | H10K 59/123 257/52 |
| 2012/0217515 | A1* | 8/2012 | Yamazaki | H10D 86/423 257/E33.053 |
| 2014/0034921 | A1* | 2/2014 | Jinta | H10K 50/11 257/40 |
| 2014/0145164 | A1* | 5/2014 | Odaka | H10K 59/8794 257/40 |
| 2014/0159026 | A1* | 6/2014 | Okumoto | H10K 10/474 257/40 |
| 2014/0353603 | A1* | 12/2014 | Lee | G09G 3/3233 257/40 |
| 2015/0171113 | A1* | 6/2015 | Honjo | H10D 30/6708 257/66 |
| 2015/0194446 | A1* | 7/2015 | Shishido | H10D 86/60 257/72 |
| 2015/0221683 | A1* | 8/2015 | Odaka | H10D 86/60 438/151 |
| 2015/0340387 | A1* | 11/2015 | Omoto | H10D 86/441 257/72 |
| 2015/0362776 | A1* | 12/2015 | Jikumaru | H10K 50/865 349/12 |
| 2016/0005804 | A1* | 1/2016 | Oh | H10K 59/1213 438/239 |
| 2017/0117499 | A1 | 4/2017 | Zhang et al. | |
| 2018/0019288 | A1* | 1/2018 | Yang | H10K 59/40 |
| 2019/0326546 | A1 | 10/2019 | Li et al. | |
| 2022/0140016 | A1* | 5/2022 | Zeng | H10K 59/124 257/72 |

FOREIGN PATENT DOCUMENTS

| | | |
|---|---|---|
| CN | 105097874 A | 11/2015 |
| CN | 105590947 A | 5/2016 |
| CN | 106531768 A | 3/2017 |
| CN | 108878504 A | 11/2018 |
| CN | 111710795 A | 9/2020 |
| CN | 111900194 A | 11/2020 |
| CN | 112670325 A | 4/2021 |
| CN | 112993187 A | 6/2021 |
| JP | 2017220452 A | 12/2017 |
| JP | 2019179716 A | 10/2019 |
| WO | 2020105544 A1 | 5/2020 |

OTHER PUBLICATIONS

Chinese Office Action issued in corresponding Chinese Patent Application No. 202111092019.X dated Jul. 14, 2023, pp. 1-8.
Chinese Office Action issued in corresponding Chinese Patent Application No. 202111092019.X dated Dec. 21, 2023, pp. 1-9.
International Search Report in International application No. PCT/CN2021/120888,mailed on Apr. 25, 2022.
Written Opinion of the International Search Authority in International application No. PCT/CN2021/120888,mailed on Apr. 25, 2022.
Japanese Office Action issued in corresponding Japanese Patent Application No. 特願2021-560016 dated Nov. 7, 2023, pp. 1-4.
Japanese Office Action issued in corresponding Japanese Patent Application No. 特願2021-560016 dated Sep. 26, 2024, pp. 1-5.
European Office Action issued in corresponding European Patent Application No. 21800973.6 dated Jun. 12, 2025, pp. 1-11.

* cited by examiner

DISPLAY PANEL AND MOBILE TERMINAL

FIELD OF INVENTION

The present disclosure relates to a display technology field, in particular to manufacture of a display device, and specifically to a display panel and a mobile terminal.

BACKGROUND OF INVENTION

An organic light-emitting diode (OLED, organic light-emitting semiconductor) display panel emits light by injection and recombination of carriers, and has advantages of lightness and thinness, high brightness, low power consumption, a fast response speed, high definition, and the like. Each of luminescent materials has different luminescent efficiency at different microcavity lengths, and microcavity lengths corresponding to higher luminescent efficiency of different luminescent materials are different. At present, a microcavity length corresponding to higher luminescent efficiency of a commonly used luminescent material is relatively large, that is, a thickness of a plurality of film layers constituting a microcavity is required to be set relatively large to achieve a relatively high luminescent efficiency; however, for a top-emission OLED display panel, setting a light-emitting layer thicker may increase absorption of light, and setting an anode layer thicker may affect etching quality. In summary, an increase in the length of the microcavity is limited.

Therefore, the limited microcavity length in the conventional top-emission OLED display panel may reduce luminous efficiency of the luminous material and screen brightness of the OLED display panel.

SUMMARY OF INVENTION

Technical Problem

An object of the present application is to provide a display panel and a mobile terminal to solve a technical problem of lower screen brightness of a display panel caused by a lower luminous efficiency of a conventional luminous material.

Technical Solution

An embodiment of the present application provides a display panel comprising:
a substrate;
an anode reflection layer on the substrate, wherein the anode reflection layer comprises a plurality of anode reflection portions;
an anode layer on the anode reflection layer, wherein the anode layer comprises a plurality of anode portions corresponding to the plurality of anode reflection portions; each of the anode portions is electrically connected to a corresponding anode reflection portion;
a light-emitting layer on the anode layer, wherein the light-emitting layer comprises a plurality of light-emitting portions corresponding to the plurality of anode portions one by one; each of the light-emitting portions is electrically connected to a corresponding anode portion; and
an auxiliary layer between the anode reflection layer and the anode layer, wherein a thickness of the auxiliary layer is greater than or equal to a first threshold value, wherein the auxiliary layer is provided with a plurality of first via holes corresponding to the plurality of anode portions, a constituent material of the auxiliary layer includes an insulating material, and each of the anode portions is electrically connected to a corresponding thin film transistor through a corresponding first via hole, and
wherein a sum of the thickness of the auxiliary layer and a thickness of the anode layer is greater than or equal to 600 angstroms.

In an embodiment, a constituent material of the auxiliary layer comprises aluminum oxide or silicon oxide.

In an embodiment, the auxiliary layer comprises a plurality of auxiliary portions corresponding to the plurality of anode portions, a constituent material of the plurality of auxiliary portions comprises a conductive material, and each of the anode portions is electrically connected to a corresponding auxiliary portion to be electrically connected to a corresponding thin film transistor.

In an embodiment, the first threshold value is 200 angstroms.

In an embodiment, the plurality of light-emitting portions comprise a first light-emitting portion and a second light-emitting portion, and a wavelength of light emitted by the first light-emitting portion is different from a wavelength of light emitted by the second light-emitting portion, and
a sum of a thickness of a portion of the auxiliary layer corresponding to the first light-emitting portion and a thickness of a portion of the anode layer corresponding to the first light-emitting portion is a first thickness, a sum of a thickness of a portion of the auxiliary layer corresponding to the second light-emitting portion and a thickness of a portion of the anode layer corresponding to the second light-emitting portion is a second thickness, and the first thickness and the second thickness are different.

In an embodiment, the display panel further comprises:
a thin film transistor layer on a side of the anode reflection layer away from the auxiliary layer, wherein the thin film transistor layer comprises a plurality of thin film transistors in one-to-one correspondence with the plurality of anode reflection portions; each of the thin film transistors is electrically connected to a corresponding anode reflection portion, and
a hydrogen barrier rate of the auxiliary layer is greater than 80%.

In an embodiment, the display panel further comprises:
a flat layer disposed entirely between the thin film transistor layer and the anode reflection layer, wherein the flat layer is provided with a plurality of second via holes corresponding to the plurality of thin film transistors, and
each of the anode reflection portions extends to a bottom of a corresponding second via hole to electrically connect to the corresponding thin film transistor.

An embodiment of the present application provides a display panel comprising:
a substrate;
an anode reflection layer on the substrate, wherein the anode reflection layer comprises a plurality of anode reflection portions;
an anode layer on the anode reflection layer, wherein the anode layer comprises a plurality of anode portions corresponding to the plurality of anode reflection portions; each of the anode portions is electrically connected to a corresponding anode reflection portion;
a light-emitting layer on the anode layer, wherein the light-emitting layer comprises a plurality of light-emitting portions corresponding to the plurality of anode portions one by one; each of the light-emitting portions is electrically connected to a corresponding anode portion; and an auxiliary layer between the anode reflection layer and the anode layer, wherein a thickness of the auxiliary layer is greater than or equal to a first threshold value.

In an embodiment, the auxiliary layer is provided with a plurality of first via holes corresponding to the plurality of anode portions, a constituent material of the auxiliary layer comprises an insulating material, and each of the anode portions is electrically connected to a corresponding thin film transistor through a corresponding first via hole.

In an embodiment, a constituent material of the auxiliary layer comprises aluminum oxide or silicon oxide.

In an embodiment, the auxiliary layer comprises a plurality of auxiliary portions corresponding to the plurality of anode portions, a constituent material of the plurality of auxiliary portions comprises a conductive material, and each of the anode portions is electrically connected to a corresponding auxiliary portion to be electrically connected to a corresponding thin film transistor.

In an embodiment, a sum of a thickness of the auxiliary layer and a thickness of the anode layer is greater than or equal to 600 angstroms.

In an embodiment, the first threshold value is 200 angstroms.

In an embodiment, the plurality of light-emitting portions comprises a first light-emitting portion and a second light-emitting portion, and a wavelength of light emitted by the first light-emitting portion is different from a wavelength of light emitted by the second light-emitting portion, and a sum of a thickness of a portion of the auxiliary layer corresponding to the first light-emitting portion and a thickness of a portion of the anode layer corresponding to the first light-emitting portion is a first thickness, a sum of a thickness of a portion of the auxiliary layer corresponding to the second light-emitting portion and a thickness of a portion of the anode layer corresponding to the second light-emitting portion is a second thickness, and the first thickness and the second thickness are different.

In an embodiment, the display panel further comprises:

a thin film transistor layer on a side of the anode reflection layer away from the auxiliary layer, wherein the thin film transistor layer comprises a plurality of thin film transistors in one-to-one correspondence with the plurality of anode reflection portions; each of the thin film transistors is electrically connected to a corresponding anode reflection portion, and a hydrogen barrier rate of the auxiliary layer is greater than 80%.

In an embodiment, the display panel further comprises:

a flat layer disposed entirely between the thin film transistor layer and the anode reflection layer, wherein the flat layer is provided with a plurality of second via holes corresponding to the plurality of thin film transistors, and each of the anode reflection portions extends to a bottom of a corresponding second via hole to electrically connect to the corresponding thin film transistor.

An embodiment of the present application provides a mobile terminal comprising a terminal body portion and any one of the display panels as described above, the terminal body portion and the display panel are integrated.

Advantageous Effects

The present application provides a display panel and a mobile terminal. The display panel includes: a substrate; an anode reflection layer on the substrate and including a plurality of anode reflection portions; an anode layer on the anode reflection layer and including a plurality of anode portions corresponding to the plurality of anode reflection portions, each of the anode portions is electrically connected to the corresponding anode reflection portion; a light-emitting layer on a side of the anode layer away from the substrate, and including a plurality of light-emitting portions corresponding to the plurality of anode portions one-to-one, each of the light-emitting portions is electrically connected to the corresponding anode portion; an auxiliary layer between the anode reflection layer and a side of the anode layer away from the light-emitting layer, a thickness of the auxiliary layer is greater than or equal to a first threshold value. In the present application, the thickness of the auxiliary layer is set to be greater than or equal to the first threshold value so that the thickness of the auxiliary layer is sufficiently large to increase the length of the microcavity corresponding to the light-emitting layer, and the light-emitting layer may have a higher luminous efficiency, thereby improving the screen brightness of the display panel.

DESCRIPTION OF DRAWINGS

The application will be further described with reference to the accompanying drawings. It should be noted that the drawings in the following description are only some embodiments of the present disclosure. For those skilled in the art, without paying any creative work, other drawings may be obtained based on these drawings.

DETAILED DESCRIPTION OF EMBODIMENTS

Figure 1:
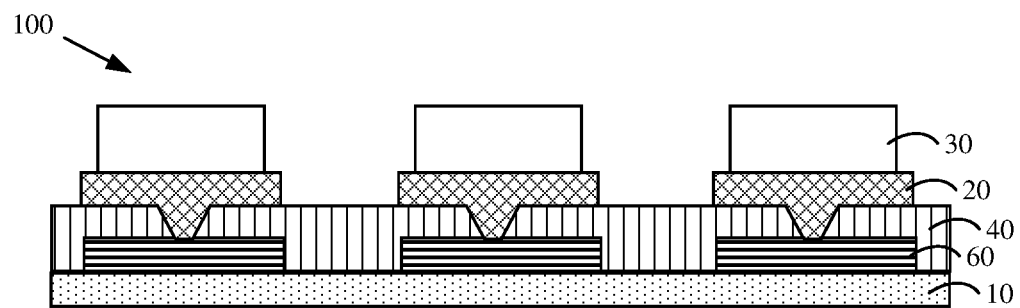
FIG. 1 is a schematic cross-sectional view of a first display panel according to an embodiment of the present application.

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

In the description of the present invention, it should be understood that the orientation or positional relationship indicated by the terms "upper", "lower", "near", "away from", etc. are based on the orientation or positional relationship shown in the drawings, for example, the term "upper" only means that a surface is above the object, specifically refers to "directly above", "obliquely above", and "upper surface", as long as it is above the level of the object; "both sides" or "both ends" refer to two opposite positions of the object which can be shown in the drawings, the two positions may be in direct or indirect contact with the object. The above orientation or positional relationship is only for the convenience of describing the present invention and simplifying the description, rather than indicating or implying that the devices or elements must have a specific orientation, and be constructed and operated in a specific orientation, and thus, it cannot be understood as a limitation of the present invention.

In addition, it should be noted that the drawings provide only structures and steps which are closely related to the present invention, and some details which are not related to the present invention are omitted. The purpose is to simplify the drawings to make the invention clear at a glance, rather than indicating that the apparatus and method in practice are the same as those in the drawings, and those in the drawings are not a limitation of the apparatus and method in practice.

The present application provides a display panel including, but not limited to, the following embodiments and combinations of the following embodiments.

Figure 2:
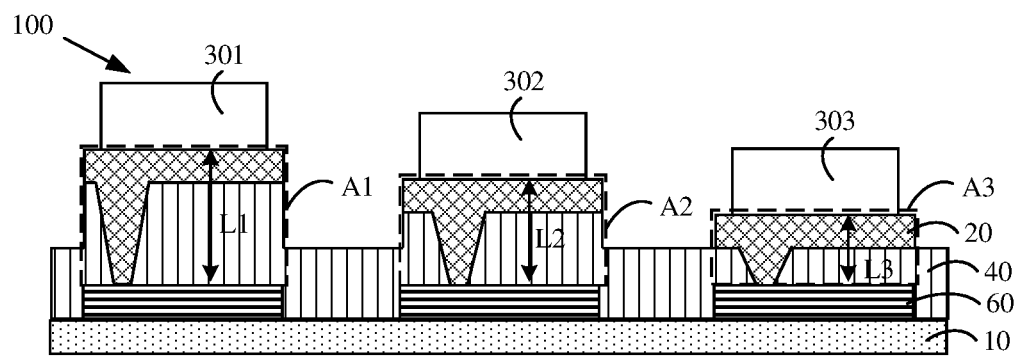
FIG. 2 is a schematic cross-sectional view of a second display panel according to an embodiment of the present application.
Figure 3:
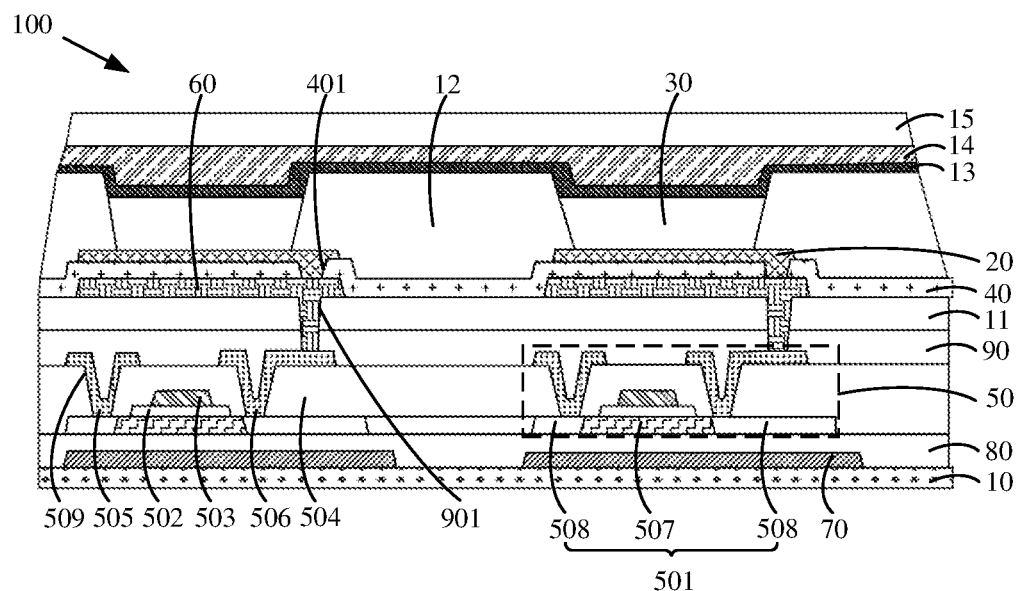
FIG. 3 is a schematic cross-sectional view of a third display panel according to an embodiment of the present application.

In an embodiment, as shown in FIGS. 1 to 3, a display panel 100 includes: a substrate 10; an anode reflection layer on the substrate 10, and including a plurality of anode reflection portions 60; an anode layer on the anode reflection layer, and including a plurality of anode portions 20 corresponding to the plurality of anode reflection portions 60, each of the anode portions 20 is electrically connected to the corresponding anode reflection portion 60; a light-emitting layer on the anode layer, and including a plurality of light-emitting portions 30 corresponding to the plurality of anode portions 20 one-to-one, each of the light-emitting portions 30 is electrically connected to the corresponding anode portion 20; an auxiliary layer 40 between the anode reflection layer and the anode layer, a thickness of the auxiliary layer 40 is greater than or equal to a first threshold value. Wherein the substrate 10 may be a rigid substrate or a flexible substrate, the rigid substrate may be a glass or a silicon wafer, a material of the rigid substrate may include but is not limited to at least one of quartz powder, strontium carbonate, barium carbonate, boric acid, boric anhydride, aluminum oxide, calcium carbonate, barium nitrate, magnesium oxide, tin oxide, and zinc oxide, the flexible substrate may be a polymer material substrate, a metal foil substrate, an ultra-thin glass substrate, a polymer-inorganic composite substrate, or a composite substrate composed of polymer, organics and inorganics, wherein a polymer material may include at least one of polyethylene, polypropylene, polystyrene, polyethylene terephthalate, polyethylene naphthalate, and polyimide.

The display panel 100 may be a top light-emitting display panel, a constituent material of the anode reflection layer may be a reflective material, and further, the constituent material of the anode reflection layer may be a metal material to achieve reflecting of light emitted by the light-emitting layer to a light-emitting surface to improve light utilization, for example, the material of the anode reflection layer may be, but is not limited to, silver or aluminum. Specifically, the plurality of anode reflection portions 60 may be formed by patterning, the auxiliary layer 40 may be formed on the anode reflection layer, and the plurality of anode portions 20 corresponding to the plurality of anode reflection portions 60 may be formed on the auxiliary layer 40 by patterning.

Specifically, a cathode layer is further provided on the light-emitting layer, the cathode layer may be disposed on an entire surface, or the cathode layer may be disposed corresponding to the plurality of light-emitting portions 30. Each of the light-emitting portions 30 may have a corresponding microcavity length, the length of the microcavity (or the microcavity length) may be defined as a vertical distance between an upper surface of the anode reflection layer and a lower surface of the cathode layer, the microcavity length may include a sum of a thickness of the corresponding anode portion 20 and a thickness of the corresponding light-emitting portion 30, and the microcavity length may affect the luminous efficiency of the corresponding light-emitting portion 30. Further, the light-emitting layer may be prepared using a technique of a white light organic light emitting diode, that is, each of the light emitting portions 30 may realize white light through a two-layered structure such as "blue+yellow", etc., or a three-layered structure such as "blue+red+green", etc., in this case, a composite light-emitting portion 30 can still have a corresponding microcavity length. A constituent material of the anode portion 20 may be, but is not limited to, indium tin oxide, the light-emitting portion 30 may be, but is not limited to, an organic light-emitting semiconductor light-emitting device, a micro light-emitting diode, or another self-emitting device, and the light-emitting portion 30 may be formed by ink jet printing or vapor deposition.

Specifically, in the present embodiment, the auxiliary layer 40 is additionally disposed on a side of the anode layer away from the light-emitting layer, wherein the first threshold value may be understood as a minimum value of the thickness of the auxiliary layer 40, and a value of the first threshold value may be determined according to the constituent material of the light-emitting portion 30 and a sum of thicknesses of other film layers for constituting the microcavity. Here, it is intended to emphasize that the thickness of the auxiliary layer 40 is at least the first threshold value, so as to satisfy requirement of the luminous efficiency of the light-emitting layer. It may be understood that the present embodiment can still increase the length of the microcavity corresponding to each of the light-emitting portions 30 without increasing thicknesses of both the anode layer and the light-emitting layer, so that the luminous efficiency of the light-emitting portion 30 is greatly improved, thereby improving brightness of a display screen of the display panel.

In an embodiment, a sum of the thickness of the auxiliary layer 40 and the thickness of the anode layer is greater than or equal to 600 angstroms as shown in FIG. 1. Specifically, as discussed above, it is possible to determine the length of the microcavity corresponding to a lowest value of a higher luminous efficiency according to at least one of the constituent material of the light-emitting portion 30 and a wavelength of light emitted, and then determine the sum of the thickness of the auxiliary layer 40 and the thickness of the anode layer according to the sum of the thicknesses of the other film layers constituting the microcavity. The "microcavity length corresponding to the lowest value of the higher luminous efficiency" can be obtained through simulation, and then the "corresponding sum of the thickness of the auxiliary layer 40 and the thickness of the anode layer" can be obtained and used as a minimum value of the sum of the thickness of the auxiliary layer 40 and the thickness of the anode layer.

In an embodiment, the first threshold value is 200 angstroms. As discussed above, as shown in FIG. 1, the thickness of the auxiliary layer 40 is greater than or equal to a first threshold value, i.e., a first threshold value is a minimum value of the thickness of the auxiliary layer 40; as can be seen from the above discussion, the minimum value of the sum of the thickness of the auxiliary layer 40 and the thickness of the anode layer can be obtained by simulation. Here, the minimum value of the thickness of the auxiliary layer 40 may be further determined according to characteristics of the constituent material of the anode layer and characteristics of a fabrication process thereof. Specifically, when the plurality of anode portions 20 are formed by using a material including indium tin oxide and an etching process, since a maximum value of the thickness of the anode layer is 400 angstroms, the minimum value of the thickness of the auxiliary layer 40 may be 200 angstroms, that is, the first threshold value may be 200 angstroms.

Specifically, when the plurality of anode portions 20 are formed by using the material including indium tin oxide and the etching process, the sum of the thickness of the auxiliary layer 40 and the thickness of the anode layer may be 800 angstroms. For example, when the thickness of the anode layer is 400 angstroms, the thickness of the auxiliary layer 40 may be 400 angstroms, and when the thickness of the anode layer is 200 angstroms, the thickness of the auxiliary layer 40 may be 600 angstroms.

In an embodiment, as shown in FIG. 2, the plurality of light-emitting portions 30 include a first light-emitting portion 301 and a second light-emitting portion 302, a wavelength of light emitted by the first light-emitting portion 301 is different from a wavelength of light emitted by the second light-emitting portion 302; wherein a thickness of a portion A1 of both the auxiliary layer 40 and the anode layer corresponding to the first light-emitting portion 301 is a first thickness L1, a thickness of the portion A2 of both the auxiliary layer 40 and the anode layer corresponding to the second light-emitting portion 302 is a second thickness L2, and the first thickness L1 and the second thickness L2 are different.

Specifically, it may be considered here that the first light-emitting portion 301 and the second light-emitting portion 302 respectively emit two light rays of different colors, that is, the wavelength of the light emitted by the first light-emitting portion 301 and the wavelength of the light emitted by the second light-emitting portion 302 are different. As discussed above, the microcavity lengths corresponding to lowest values of the higher luminous efficiency of two light-emitting portions 30 with different wavelengths of the light emitted are generally different, that is, a preferred microcavity length of the first light-emitting portion 301 is different from a preferred microcavity length of the second light-emitting portion 302 in consideration of the higher luminous efficiency. Similarly, as shown in FIG. 2, when the plurality of light-emitting portions 30 further include a third light-emitting portion 303 emitting a light ray having a wavelength different from any one of two of the wavelength of the light emitting by the first light-emitting portion 301 and the wavelength of the light emitting by the second light-emitting portion 302, a thickness of a portion A3 of both the auxiliary layer 40 and the anode layer corresponding to the third light-emitting portion 303 is a third thickness L3, and the third thickness L3 is not equal to any one of the first thickness L1 and the second thickness L2. Specifically, an example in which the thickness of the portion A1 of both the auxiliary layer 40 and the anode layer corresponding to the first light-emitting portion 301 is the first thickness L1 is described, the first thickness L1 may be understood as a distance between an upper surface of the corresponding anode reflection portion 60 and an upper surface of the corresponding anode portion 20.

It may be understood that, for each of the light-emitting portions 30, the microcavity length may include the sum of the thickness of the corresponding anode portion 20 and a thickness of corresponding portions of the auxiliary layer 40. In this embodiment, for the plurality of light-emitting portions 30 emitting the light rays having different wavelengths, the thicknesses of the auxiliary layer 40 and the corresponding portions of the anode layer are set differently, and a difference in the wavelengths of the lights emitted by the light-emitting portions 30 may be fully considered, which is conducive to realizing setting the microcavity length corresponding to the plurality of light-emitting portions 30 emitting the light rays having different wavelengths differently, and improving the luminous efficiency of each of the light-emitting portions 30.

In an embodiment, as shown in FIG. 3, the display panel 100 further includes a thin film transistor layer located on a side of the anode reflection layer away from the auxiliary layer 40, the thin film transistor layer includes a plurality of thin film transistors 50 corresponding to the plurality of anode reflection portions 60 one to one, each of the thin film transistors 50 is electrically connected to the corresponding anode reflection portion 60; wherein a hydrogen barrier rate of the auxiliary layer 40 is greater than 80%.

Specifically, as shown in FIG. 3, each of the thin film transistors 50 includes an active layer 501, a gate insulating layer 502 located on the active layer 501, a gate layer 503 located on the gate insulating layer 502, an interlayer insulating layer 504 covering the active layer 501, the gate insulating layer 502, and the gate layer 503, and a source 505 and a drain 506 located on the interlayer insulating layer 504, the active layer 501 includes a body portion 507 and two doped portions 508 located at both ends of the body portion 507, the interlayer insulating layer 504 is provided with a plurality of third via holes 509, the source 505 is electrically connected to one of the doped portions 508 through one of the third via holes 509, and the drain 506 is electrically connected to another one of the doped portions 508 through another one of the third via holes 509. The thin film transistor 50 may be a bottom gate structure or a top gate structure, and the top gate structure may be but is not limited to a structure of the thin film transistor 50 as shown in FIG. 3.

A constituent material of the active layer 501 includes a metal oxide. Specifically, the constituent material of the active layer 501 may include indium gallium zinc oxide, indium gallium tin oxide, indium gallium oxide, indium zinc oxide, aluminum indium zinc oxide, indium gallium zinc tin oxide, or other metal oxide, and further, the constituent material of the active layer 501 may include an amorphous metal oxide. It should be noted that, the active layer 501 made of metal oxide is extremely sensitive to hydrogen, and when the hydrogen diffuses from a side of the light-emitting layer away from the substrate 10 to the active layer 501, parameters such as a threshold voltage of the thin film transistor 50 are affected, so that reliability of operations of the thin film transistor 50 is reduced.

It may be understood that the auxiliary layer 40 in this embodiment is located on a side of the thin film transistor layer away from the substrate 10 and between the thin film transistor layer and the anode layer, that is, the auxiliary layer 40 is located on a side of the thin film transistor close to external hydrogen, and is closer to the thin film transistor layer, that is, on a basis that the auxiliary layer 40 in this embodiment may increase the length of the microcavity corresponding to each of the light-emitting portions 30 to improve the luminous efficiency of the light-emitting portion 30, the auxiliary layer 40 may also prevent the hydrogen from diffusing into the thin film transistor layer through reasonable settings of the material and the thickness. Further, the hydrogen barrier rate of the auxiliary layer 40 is limited to be greater than 80%, so that a hydrogen barrier effect of the auxiliary layer 40 may be further ensured.

The auxiliary layer 40 having a hydrogen barrier rate greater than 80% can be determined by a Thermal Desorption Spectroscopy (TDS) method, the thermal desorption refers to a desorption method in which volatiles are eluted from a solid or liquid sample by heating and inert gas purging and the volatiles are conveyed to an analysis system by a carrier gas. Specifically, a first substrate may be prepared in advance, the first substrate includes a glass substrate and a silicon nitride layer located on the glass substrate, and the first substrate may be heated to a preset temperature in a closed environment to measure a content of a hydrogen in the closed environment as a first content; on this basis, a simulation layer may be prepared on the silicon nitride layer, and the parameters such as the material, the thickness, and the like of the simulation layer may be adjusted multiple times to satisfy that: the first substrate is heated to the preset temperature in the closed environment, and the hydrogen content in the closed environment is measured as a second content, and a ratio of the second content to the first content is greater than 80%, for example, 85%. In this case, the simulation layer may be used as the auxiliary layer 40. The preset temperature may be a temperature required for manufacturing the thin film transistor 50, and the preset temperature may be 300° C. Further, in combination with the above-described TDS method, the auxiliary layer 40 in the present embodiment may satisfy that compared with an absence of the auxiliary layer 40, the content of the hydrogen diffused into the active layer 501 is reduced to 20%, that is, 80% of the hydrogen may be blocked.

In an embodiment, as shown in FIG. 3, the display panel 100 further includes a flat layer 11 disposed entirely between the thin film transistor layer and the anode reflection layer, and a plurality of second via holes 901 corresponding to the plurality of thin film transistors 50 are defined in the flat layer 11; each of the anode reflection portions 60 extends to a bottom of the corresponding second via hole 901 to be electrically connect to the corresponding thin film transistor 50.

A constituent material of the flat layer 11 may be an insulating material. Specifically, as shown in FIG. 3, the display panel 100 further includes a plurality of light shielding portions 70 located on a side of the substrate 10 close to the thin film transistor layer, a buffer layer 80 covering the plurality of light shielding portions 70 and the substrate 10, and a passivation layer 90 covering the plurality of thin film transistors 50, the flat layer 11 is located on the passivation layer 90, the plurality of anode reflection portions 60 are located on the flat layer 11, and the auxiliary layer 40 may cover the flat layer 11 and the plurality of anode reflection portions 60. Further, a pixel defining portion 12 may be formed between two adjacent light-emitting portions 30 on the auxiliary layer 40, a plurality of the pixel defining portions 12 and the plurality of light-emitting portions 30 may be covered with a continuous cathode layer 13, and an encapsulation layer 14 and a cover plate 15 may be sequentially provided on a cathode layer 13.

A constituent material of the plurality of light shielding portions 70 includes metal material, each of the light shielding portions 70 may not only reflect light from one side of the substrate 10 to a side away from the active layer 501 to improve utilization of light, but also reduce a light passing rate from one side of the substrate 10 to avoid degradation of the reliability of the operations of the thin film transistor 50 caused by the light irradiating the active layer 501. A constituent material of the buffer layer 80 may include but is not limited to silicon oxide, silicon nitride, or silicon oxynitride. A constituent material of the gate layer 503 may include, but is not limited to, copper, aluminum, molybdenum, or titanium, and of course the constituent material of the gate layer 503 may also include a metal oxide, a metal nitride, or a metal oxynitride. A constituent material of the gate insulating layer 502 may include but is not limited to silicon oxide or silicon nitride. A constituent material of the interlayer insulating layer 504 may include but is not limited to silicon oxide, silicon nitride, or silicon oxynitride. Constituent materials of the source 505 and the drain 506 may include but is not limited to molybdenum, aluminum, copper, titanium, indium tin oxide, or a copper-niobium alloy. Further, the second via hole 901 may extend through the passivation layer 90, each of the anode reflection portions 60 extends to the bottom of the second via hole 901 to electrically connect to a corresponding drain 506, and as discussed above, each of the anode portions 20 is electrically connected to the corresponding drain 506 through the anode reflection portion 60 so as to be loaded with a first voltage, the cathode layer 13 may be applied with a second voltage, and each of the light-emitting portions 30 generates a current to emit light under an action of the first voltage and the second voltage.

It should be noted that, in a process of manufacturing the package layer 14 and in a process of testing reliability of the display panel 100, since constituent materials of the plurality of pixel defining portions 12 include organic materials, external hydrogen may diffuse into the plurality of thin film transistors 50 through the plurality of pixel defining portions 12, and when the external hydrogen diffuses into the active layer 501, the reliability of the operations of the thin film transistors 50 may degrade. It may be understood that in the present application, by providing the auxiliary layer 40 between the anode layer and the anode reflection layer, the hydrogen may be prevented from diffusing into the active layer 501, thereby improving the reliability of the operations of the thin film transistor 50.

In an embodiment, as shown in FIG. 3, the auxiliary layer 40 is provided with a plurality of first via holes 401 corresponding to the plurality of anode portions 20, the constituent material of the auxiliary layer 40 includes an insulating material, and each of the anode portions 20 is electrically connected to the corresponding thin film transistor 50 through a corresponding first via hole 401. Specifically, as shown in FIG. 3, in the auxiliary layer 40, a portion between two adjacent first via holes 401 may be continuously disposed such that a projection of the auxiliary layer 40 on the anode layer covers the anode portion 20 and a region between the two adjacent anode portions 20, and each of the anode portions 20 may extend to the corresponding thin film transistor 50 through the corresponding first via hole 401 for electrical connection.

It may be understood that in the present embodiment, the portions of the auxiliary layer 40 except for the plurality of first via holes 401 are continuously disposed, and may cover a film layer on a side of the auxiliary layer 40 away from the anode layer, so as to sufficiently block a path of diffusion of external hydrogen to the plurality of thin film transistors 50, and further improve a hydrogen blocking effect of the auxiliary layer 40. It should be noted that since the portions between the two adjacent first via holes 401 in the auxiliary layer 40 are connected between two adjacent anode portions 20, and the constituent material of the auxiliary layer 40 in this embodiment includes an insulating material, a short circuit due to an electrical connection between the two adjacent anode portions 20 may be avoided. Specifically, the plurality of anode reflection portions 60 may be formed by patterning, the auxiliary layer 40 is formed by depositing aluminum oxide and forming the plurality of first via holes 401, a layer of indium tin oxide may be further deposited, and a plurality of the anode portions 20 extending into the plurality of first via holes 401 may be formed by patterning. A sum of the thickness of the anode portions 20 and the thickness of the auxiliary layer 40 may be referred to related discussion above.

In an embodiment, as shown in FIG. 3, the constituent material of the auxiliary layer 40 includes aluminum oxide or silicon oxide. Both aluminum oxide and silicon oxide may block diffusion of the hydrogen to the thin film transistor layer, and both may also be formed as the transparent auxiliary layer 40 to increase light transmittance, which may be greater than 20%, or even greater than 98%. Further, the auxiliary layer 40 may be made of high-density aluminum oxide to further increase the hydrogen barrier rate of the auxiliary layer 40.

Figure 4:
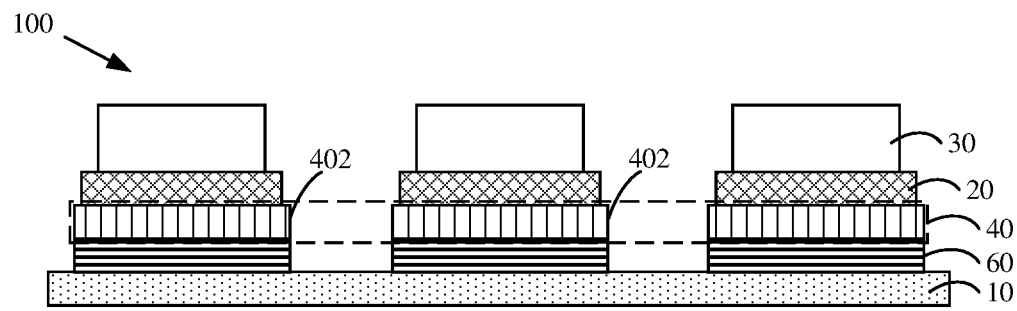
FIG. 4 is a schematic cross-sectional view of a fourth display panel according to an embodiment of the present application.

In an embodiment, as shown in FIG. 4, the auxiliary layer 40 includes a plurality of auxiliary portions 402 corresponding to the plurality of anode portions 20, constituent materials of the plurality of auxiliary portions 402 include conductive materials, and each of the anode portions 20 is electrically connected to a corresponding auxiliary portion 402 to electrically connect to the corresponding thin film transistors. It should be noted that the projection of the auxiliary layer 40 on the anode layer covers the anode portion 20, that is, no auxiliary layer 40 is provided between the two adjacent anode portions 20, while each of the auxiliary portions 402 is located between the corresponding anode portion 20 and the corresponding thin film transistor, that is, the constituent material of the plurality of auxiliary portions 402 in the present embodiment includes a conductive material such that the plurality of auxiliary portions 402 may have higher conductivity to electrically connect each of the anode portions 20 to the corresponding thin film transistor.

The present application provides a mobile terminal including a terminal body portion and any one of the display panels as described above, the terminal body portion and the display panel are integrated.

The present application provides a display panel and a mobile terminal, the display panel includes: a substrate; an anode reflection layer on the substrate, and including a plurality of anode reflection portions; an anode layer on the anode reflection layer, and including a plurality of anode portions corresponding to the plurality of anode reflection portions, each of the anode portions is electrically connected to the corresponding anode reflection portions; a light-emitting layer on a side of the anode layer away from the substrate, and including a plurality of light-emitting portions corresponding to the plurality of anode portions one to one, each of the light-emitting portions is electrically connected to the corresponding anode portion; an auxiliary layer between the anode reflection layer and a side of the anode layer away from the light-emitting layer, a thickness of the auxiliary layer is greater than or equal to a first threshold value. In the present application, the thickness of the auxiliary layer is set to be greater than or equal to the first threshold value so that the thickness of the auxiliary layer is sufficiently large to increase a length of a microcavity corresponding to the light-emitting layer, and the light-emitting layer may have higher luminous efficiency, thereby improving screen brightness of the display panel.

The display panel and the mobile terminal provided in the embodiments of the present application are described in detail above. Specific examples are used in this article to illustrate the principles and implementations of the present disclosure. The description of the embodiments is merely intended to help understand the technical solutions and core ideas of the present application. Those of ordinary skill in the art will appreciate that they may still modify the technical solutions described in the foregoing embodiments, or equivalently replace some of the technical features therein; these modifications or substitutions do not deviate the nature of the respective solutions from the scope of the solutions of the embodiments of the present application.

What is claimed is:

1. A display panel, comprising:
a substrate;
an anode reflection layer on the substrate, wherein the anode reflection layer comprises a plurality of anode reflection portions;
an anode layer on the anode reflection layer, wherein the anode layer comprises a plurality of anode portions corresponding to the plurality of anode reflection portions; each of the anode portions is electrically connected to a corresponding anode reflection portion;
a light-emitting layer on the anode layer, wherein the light-emitting layer comprises a plurality of light-emitting portions corresponding to the plurality of anode portions one to one;
each of the light-emitting portions is electrically connected to a corresponding anode portion;
an auxiliary layer between the anode reflection layer and the anode layer, wherein a thickness of the auxiliary layer is greater than or equal to a first threshold value, and a projection of the auxiliary layer on the anode layer covers the plurality of anode portions and a region between the two adjacent anode portions;
wherein the auxiliary layer is provided with a plurality of first via holes corresponding to the plurality of anode portions, a constituent material of the auxiliary layer includes an insulating material, and each of the anode portions is electrically connected to a corresponding thin film transistor through a corresponding first via hole, and
wherein a sum of the thickness of the auxiliary layer and a thickness of the anode layer is greater than or equal to 600 angstroms.

2. The display panel of claim 1, wherein a constituent material of the auxiliary layer comprises aluminum oxide or silicon oxide.

3. The display panel of claim 1, wherein the auxiliary layer comprises a plurality of auxiliary portions corresponding to the plurality of anode portions, a constituent material of the plurality of auxiliary portions comprises a conductive material, and each of the anode portions is electrically connected to a corresponding auxiliary portion to be electrically connected to a corresponding thin film transistor.

4. The display panel of claim 1, wherein the first threshold value is 200 angstroms.

5. The display panel of claim 1, wherein the plurality of light-emitting portions comprise a first light-emitting portion and a second light-emitting portion, and a wavelength of light emitted by the first light-emitting portion is different from a wavelength of light emitted by the second light-emitting portion, and
wherein a sum of a thickness of a portion of the auxiliary layer corresponding to the first light-emitting portion and a thickness of a portion of the anode layer corresponding to the first light-emitting portion is a first thickness, a sum of a thickness of a portion of the auxiliary layer corresponding to the second light-emitting portion and a thickness of a portion of the anode layer corresponding to the second light-emitting portion is a second thickness, and the first thickness and the second thickness are different.

6. The display panel of claim 1, wherein the display panel further comprises:
a thin film transistor layer on a side of the anode reflection layer away from the auxiliary layer, wherein the thin film transistor layer comprises a plurality of thin film transistors in one-to-one correspondence with the plurality of anode reflection portions; each of the thin film transistors is electrically connected to a corresponding anode reflection portion, and
wherein a hydrogen barrier rate of the auxiliary layer is greater than 80%.

7. The display panel of claim 6, wherein the display panel further comprises:
a flat layer disposed entirely between the thin film transistor layer and the anode reflection layer, wherein the flat layer is provided with a plurality of second via holes corresponding to the plurality of thin film transistors, and
wherein each of the anode reflection portions extends to a bottom of a corresponding second via hole to electrically connect to a corresponding thin film transistor.

8. A display panel, comprising:
a substrate;
an anode reflection layer on the substrate, wherein the anode reflection layer comprises a plurality of anode reflection portions;
an anode layer on the anode reflection layer, wherein the anode layer comprises a plurality of anode portions corresponding to the plurality of anode reflection portions; each of the anode portions is electrically connected to a corresponding anode reflection portion;
a light-emitting layer on the anode layer, wherein the light-emitting layer comprises a plurality of light-emitting portions corresponding to the plurality of anode portions one by one; each of the light-emitting portions is electrically connected to a corresponding anode portion; and
an auxiliary layer between the anode reflection layer and the anode layer, wherein a thickness of the auxiliary layer is greater than or equal to a first threshold value and a projection of the auxiliary layer on the anode layer covers the plurality of anode portions and a region between the two adjacent anode portions.

9. The display panel of claim 8, wherein the auxiliary layer is provided with a plurality of first via holes corresponding to the plurality of anode portions, a constituent material of the auxiliary layer comprises an insulating material, and each of the anode portions is electrically connected to a corresponding thin film transistor through a corresponding first via hole.

10. The display panel of claim 9, wherein a constituent material of the auxiliary layer comprises aluminum oxide or silicon oxide.

11. The display panel of claim 8, wherein the auxiliary layer comprises a plurality of auxiliary portions corresponding to the plurality of anode portions, a constituent material of the plurality of auxiliary portions comprises a conductive material, and each of the anode portions is electrically connected to a corresponding auxiliary portion to be electrically connected to a corresponding thin film transistor.

12. The display panel of claim 8, wherein a sum of a thickness of the auxiliary layer and a thickness of the anode layer is greater than or equal to 600 angstroms.

13. The display panel of claim 12, wherein the first threshold value is 200 angstroms.

14. The display panel of claim 8, wherein the plurality of light-emitting portions comprises a first light-emitting portion and a second light-emitting portion, and a wavelength of light emitted by the first light-emitting portion is different from a wavelength of light emitted by the second light-emitting portion, and
wherein a sum of a thickness of a portion of the auxiliary layer corresponding to the first light-emitting portion and a thickness of a portion of the anode layer corresponding to the first light-emitting portion is a first thickness, a sum of a thickness of a portion of the auxiliary layer corresponding to the second light-emitting portion and a thickness of a portion of the anode layer corresponding to the second light-emitting portion is a second thickness, and the first thickness and the second thickness are different.

15. The display panel of claim 8, wherein the display panel further comprises:
a thin film transistor layer on a side of the anode reflection layer away from the auxiliary layer, wherein the thin film transistor layer comprises a plurality of thin film transistors in one-to-one correspondence with the plurality of anode reflection portions; each of the thin film transistors is electrically connected to a corresponding anode reflection portion, and wherein a hydrogen barrier rate of the auxiliary layer is greater than 80%.

16. The display panel of claim 15, wherein the display panel further comprises:
a flat layer disposed entirely between the thin film transistor layer and the anode reflection layer, wherein the flat layer is provided with a plurality of second via holes corresponding to the plurality of thin film transistors, and
wherein each of the anode reflection portions extends to a bottom of a corresponding second via hole to electrically connect to a corresponding thin film transistor.

17. A mobile terminal, wherein the mobile terminal comprises a terminal body portion and a display panel of claim 8, and the terminal body portion and the display panel are integrated.

18. The mobile terminal of claim 17, wherein the auxiliary layer is provided with a plurality of first via holes corresponding to the plurality of anode portions, a constituent material of the auxiliary layer comprises an insulating material, and each of the anode portions is electrically connected to a corresponding thin film transistor through a corresponding first via holes.

19. The mobile terminal of claim 18, wherein the constituent material of the auxiliary layer comprises aluminum oxide or silicon oxide.

20. The mobile terminal of claim 17, wherein the auxiliary layer comprises a plurality of auxiliary portions corresponding to the plurality of anode portions, a constituent material of the plurality of auxiliary portions comprises a conductive material, each of the anode portions is electrically connected to a corresponding auxiliary portion to be electrically connected to a corresponding thin film transistor.

* * * * *